US009429614B2

(12) United States Patent
Jefferies

(10) Patent No.: US 9,429,614 B2
(45) Date of Patent: Aug. 30, 2016

(54) OPEN POTENTIOMETER DETECTION SYSTEM

(71) Applicant: Schneider Electric USA, Inc., Palatine, IL (US)

(72) Inventor: Kevin Jefferies, Raleigh, NC (US)

(73) Assignee: SCHNEIDER ELECTRIC USA, INC., Andover, MA (US)

(*) Notice: Subject to any disclaimer, the term of this patent is extended or adjusted under 35 U.S.C. 154(b) by 915 days.

(21) Appl. No.: 13/731,636

(22) Filed: Dec. 31, 2012

(65) Prior Publication Data

US 2014/0184252 A1   Jul. 3, 2014

(51) Int. Cl.
*G01R 31/00* (2006.01)
*G01R 31/02* (2006.01)

(52) U.S. Cl.
CPC .................. *G01R 31/026* (2013.01)

(58) Field of Classification Search
CPC .. G01R 27/02; G01R 31/2829; G01R 15/04; G01R 31/026
USPC ............................ 324/714, 723, 601, 750.01
See application file for complete search history.

(56) References Cited

U.S. PATENT DOCUMENTS

| 4,987,372 | A * | 1/1991 | Ofori-Tenkorang ... | G01R 27/02 324/705 |
| 6,181,141 | B1 * | 1/2001 | Juntunen ................ | G01R 27/08 324/525 |
| 2008/0094080 | A1 | 4/2008 | Dorwarth et al. | |

FOREIGN PATENT DOCUMENTS

| DE | EP 2511719 A1 * | 10/2012 | ............. G01R 31/02 |
| EP | 2151670 | 8/2008 | |
| EP | 2511719 | 10/2012 | |

OTHER PUBLICATIONS

International Search Report of International Application No. PCT/US2013/077284—Date of Completion of Search: Apr. 2, 2014—3 pages.
PCT Written Opinion of the International Searching Authority for International Application No. PCT/US2013/077284—Date of Completion of Opinion: Apr. 2, 2014—6 pages.
English Language Machine Translation of European Patent Publication No. EP 2511719—10 pages.

* cited by examiner

*Primary Examiner* — Daniel Miller
(74) *Attorney, Agent, or Firm* — Locke Lord LLP

(57) ABSTRACT

A system to detect whether a potentiometer is in an open circuit condition is disclosed. The system includes a potentiometer having an adjustable arm. A low pass filter is coupled to the adjustable arm. A controller has a first driver output coupled to a voltage input of the potentiometer and a second driver output coupled to the adjustable arm. The controller determines failure of the potentiometer by setting the first driver output to a high value. A first sample voltage from the adjustable arm is read and determined whether the first sample voltage is between a high and a low threshold value. The first driver output is set to a low value. A voltage is applied to the adjustable arm via the second driver output. A second sample is read from the adjustable input and it is determined whether the second sample is below an arm threshold value.

20 Claims, 6 Drawing Sheets

OPEN POTENTIOMETER DETECTION SYSTEM

TECHNICAL FIELD

The present disclosure relates generally to a potentiometer system and more specifically to a detection system to determine the failure of a potentiometer.

BACKGROUND

Potentiometer applications include a wide variety of electronic devices and uses within the devices. Potentiometers are commonly used to provide input from sensors and controls, by achieving a defined relationship between a mechanical position and a variable resistance. An electronic measurement system monitors the dependent resistance characteristic of the potentiometer to determine the mechanical position, and subsequently an output voltage related to the position of the device is determined. One example application of a potentiometer is an adjustment dial for a user interface to an electronic motor overload relay.

These electronic systems depend on defined performance characteristics of the potentiometer. Potentiometer manufacturers define performance variations over various criteria, such as application temperature or the vibration environment. However, eventually all potentiometers succumb to some wear out and fail. When the potentiometer fails, the electronic system no longer receives the input that was controlled or monitored through the potentiometer. This can correspond to a loss of functionality in the device using the potentiometer because of the loss of electrical input from the monitored sensors or controls.

Today, multiple approaches exist to address the eventual wear out and resulting failure of the potentiometer. One approach uses analysis and testing to demonstrate that the potentiometer will not fail over the service life of the device. In this case, the failure is not actively detected or mitigated in the application, however the robustness of the potentiometer is deemed adequate to avoid a loss of functionality in the device. Another approach uses detection means to determine when the potentiometer has failed, and to take some subsequent action. The action may include alerting the user, or entering a safe state such as shutting down the device.

Prior methods of detecting potentiometer failure exist. However the known methods involve overhead and cost, including the need for additional physical components, which are not suitable for all applications. Known methods also include monitoring characteristics of the potentiometer, which may be important in some applications, but not important in others. An example application with constraints on component cost that is impacted by specific failure modes of the potentiometer is an electronic motor overload relay.

In such an electronic motor overload relay, a potentiometer may be used as a voltage divider, where the divided voltage is determined by the position of an adjustment dial for a user interface to set the motor full load current parameter for the device. When the potentiometer is used as a voltage divider in this application, changes in some parameters of the potentiometer during the motor life such as change in the resistance value over temperature, do not affect the performance of the potentiometer in the device. However, a failure in which any connection within the potentiometer becomes open circuit, either between mechanical interfaces of the potentiometer subcomponents or between the potentiometer and the electronic board, can affect the performance of the device.

Thus, a need exists for a potentiometer failure detection system that reliably detects the failure of a potentiometer. There is a further need for a system that uses components for the reading of a potentiometer to determine failures. There is also a need for a detection system that can identify the specific source of the failure for the device in which it is permissible or preferred to continue operating in the presence of certain distinguishable potentiometer failures.

SUMMARY

One disclosed example is a system to detect whether a potentiometer is in an open circuit condition. The system includes the potentiometer, which has a resistive element coupled between a voltage input and ground and an adjustable arm determining the resistance of the resistive element. A controller has a first driver output coupled to the voltage input of the potentiometer and a second driver output coupled to the adjustable arm. An analog to digital converter is also coupled to the adjustable arm to read the voltage of the potentiometer. The controller runs a routine to determine failure of the potentiometer. The routine sets the first driver output coupled to the voltage input of the potentiometer to a high value. A first sample voltage from the adjustable arm is read. It is determined whether the first sample voltage is between a high threshold and a low threshold value. If the first sample is outside the high and low threshold values, a potentiometer failure may be detected. The first driver output coupled to the voltage input of the potentiometer is then set to a low value. A voltage is then applied to the adjustable arm via the second driver output. A second voltage sample from the adjustable arm is read. Depending on whether the second sample is below an arm threshold value, a failure may be determined of the potentiometer.

Thus, the detection system allows the detection of failure modes of the potentiometer, which are critical in particular applications, specifically an open circuit involving the potentiometer. The disclosed method does not add any cost in terms of additional components specific to the purpose of detecting the potentiometer failure. The use of a microcontroller to detect the open circuit condition in a circuit using a potentiometer is an additional advantage.

Additional aspects will be apparent to those of ordinary skill in the art in view of the detailed description of various embodiments, which is made with reference to the drawings, a brief description of which is provided below.

BRIEF DESCRIPTION OF THE DRAWINGS

The foregoing and other advantages of the invention will become apparent upon reading the following detailed description and upon reference to the drawings.

Figure 1A:
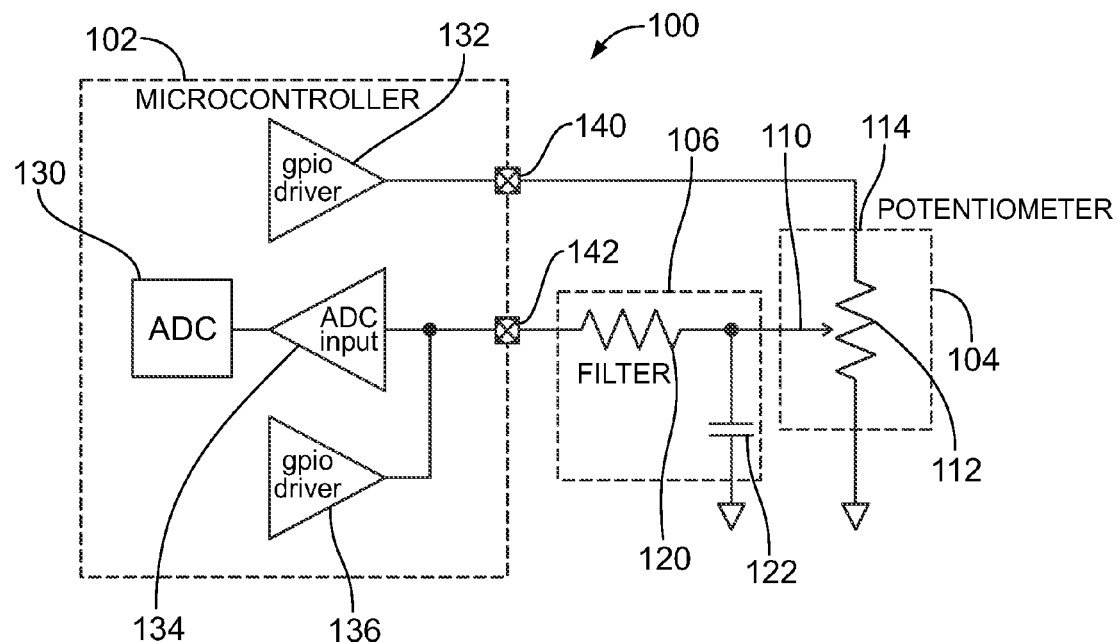
FIG. 1A is a circuit diagram of a potentiometer failure detection system and an associated controller.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

One disclosed example is a system to detect whether a potentiometer is in an open circuit condition. The system includes a potentiometer having a resistive element coupled between a voltage input and ground and an adjustable arm. The position of the adjustable arm on the resistive element determines the voltage output at the adjustable arm. A controller has a first driver coupled to the voltage input of the potentiometer and a second driver coupled to the adjustable arm. The controller determines failure of the potentiometer by setting the first driver output coupled to the voltage input of the potentiometer to a high value. The controller then reads a first sample voltage from the adjustable arm and determines whether the first sample voltage is between a maximum threshold and a minimum threshold value. The controller sets the first driver coupled to the voltage input of the potentiometer to a low value. The controller applies a voltage to the adjustable arm via the second driver. The controller reads a second sample from the adjustable input and determines whether the second sample is above an arm threshold value.

Another example is a method of determining the failure of a potentiometer having an resistive element coupled between a voltage input and ground and an adjustable arm determining the resistance of the resistive element. A first driver output coupled to the voltage input of the potentiometer is set to a high value. A first sample voltage is read from the adjustable arm. It is determined whether the first sample voltage is between a high threshold and a low threshold value. The first driver output coupled to the voltage input of the potentiometer is set to a low value. A voltage is applied to the adjustable arm via a second driver output. A second sample is read from the adjustable input and it is determined whether the second sample is below an arm threshold value.

Another disclosed example is a method of determining the failure of a potentiometer having a resistive element coupled between a voltage input and ground and an adjustable arm determining the resistance of the resistive element. The method uses a controller having a first driver output and a second driver output. The first driver output is coupled to the voltage input of the potentiometer and the second driver output is coupled to the adjustable arm. The first driver output coupled to the voltage input of the potentiometer is set to a high value via a controller. A first sample voltage is read from the adjustable arm after a delay determined by the time constant of a low pass capacitor coupled to the adjustable arm. It is determined whether the first sample voltage is between a high threshold and a low threshold value. The first driver output coupled to the voltage input of the potentiometer is set to a low value. A voltage is applied to the adjustable arm via the second driver output. A second sample is read from the adjustable input after a delay determined by the time constant of a low pass capacitor coupled to the adjustable arm. It is determined whether the second sample is below an arm threshold value via the controller.

FIG. 1A shows a potentiometer failure detection system 100 having a microcontroller 102 coupled to a potentiometer 104 and a low pass anti-aliasing filter 106. The potentiometer 104 includes an adjustable wiper arm 110, which is coupled to a resistive element 112. The low pass filter 106 is coupled to the adjustable wiper arm 110. The position of the wiper arm 110 determines the voltage between a voltage supply input 114 and ground by dividing the resistive element 112. Thus, the voltage output at the wiper arm 110 is lowest when the wiper arm 110 is at the end of the resistive element 112 closest to ground. The voltage output of the wiper arm 110 is the highest when the wiper arm 110 is moved closest to the end of the resistive element 112 coupled to the voltage supply input 114. As is commonly understood the wiper arm 110 is attached to a moveable physical object whose position is associated with the position of the wiper arm 110 on the resistive element 112. The output voltage of the potentiometer 104 at the wiper arm 110 is proportional to the position of the wiper arm 110 on the resistive element 112. The low pass filter 106 includes a resistor 120, which is coupled to a capacitor 122 on the resistive element 112. The other end of the capacitor 122 is coupled to ground.

The microcontroller 102 includes an analog to digital converter (ADC) 130, a first general purpose input/output (GPIO) driver 132, an analog to digital input 134, and a second GPIO driver 136. The microcontroller 102 includes a voltage output pin 140 and an analog voltage input/output pin 142. The microcontroller 102 uses the first general purpose input/output (GPIO) driver 132 coupled to the voltage input 114 of the potentiometer 104 via the voltage output pin 140 to apply a voltage across the potentiometer 104. The voltage at the potentiometer wiper arm 110 is filtered through the simple first order low pass anti-aliasing filter 106 and input to the analog to digital converter (ADC) 130 via the analog input/output pin 142. The analog to digital converter 130 samples the analog input voltage signal from the wiper arm 110 and converts it to a digital value for analysis by the microcontroller 102 to detect failure of the potentiometer 104 because the potentiometer 104 is in an open circuit condition as will be explained. In the microcontroller 102, the analog input/output pin 142 is shared with the second GPIO driver 136 and may be toggled between an output function and an input function by a control signal to couple the second GPIO driver 136 to the adjustable wiper arm 110.

The microcontroller 102 may be a microprocessor, a processor, an application specific integrated circuit (ASIC), a programmable logic controller (PLC), a programmable logic device (PLD), a field programmable logic device (FPLD), a field programmable gate array (FPGA), discrete logic, etc. or any other similar device. The microcontroller 102 may include a memory (not shown), which may include hardware, firmware, or tangible machine-readable storage media that store instructions and data for performing the operations described herein. Machine-readable storage media includes any mechanism that stores information and provides the information in a form readable by a machine. For example, machine-readable storage media includes read only memory (ROM), random access memory (RAM), magnetic disk storage media, optical storage media, flash memory, etc.

Figure 2A:
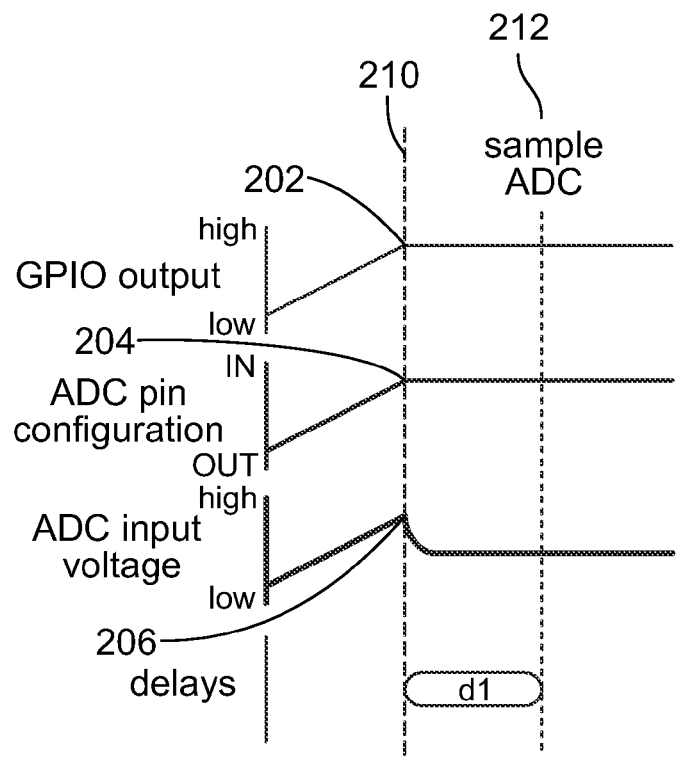
FIG. 2A is a timing diagram showing the signals used in monitoring the potentiometer in FIG. 1A.

The sampling process may be performed according to the timing diagram shown in FIG. 2A. The timing diagram in FIG. 2A includes a GPIO output signal 202, a control voltage signal 204, and an ADC input voltage signal 206. The GPIO output signal 202 is the voltage output from the voltage output pin 140 of the microcontroller 102 coupled to the input 114 of the potentiometer 104. The control voltage signal 204 toggles the input/output pin 142 between the output function providing a voltage from the second GPIO driver 136 and the input function providing an input signal from the wiper arm 110 to the ADC 130. The ADC input voltage signal 206 is the signal that is output from the wiper arm 110, which is read by the ADC 130.

To prepare to read the position of the wiper arm 110 on the potentiometer 104, the GPIO output signal 202 from the first GPIO driver 132 is set to a high value to provide voltage to the potentiometer 104 at a first time period 210. The control voltage 204 is set high in order to set the input/output pin 142 to accept an analog input signal from the wiper arm 110 at the first time period 210. After a delay period sufficient for the time constant of the capacitor 122 of the low pass anti-aliasing filter 106 used in the system 100, the ADC input voltage signal 206 is sampled by the microcontroller 102 at a second time period 212 and the position of the wiper arm 110 of the potentiometer 104 may be determined from the value of the input signal 206 converted by the ADC 130 to a digital value.

Figure 1B:
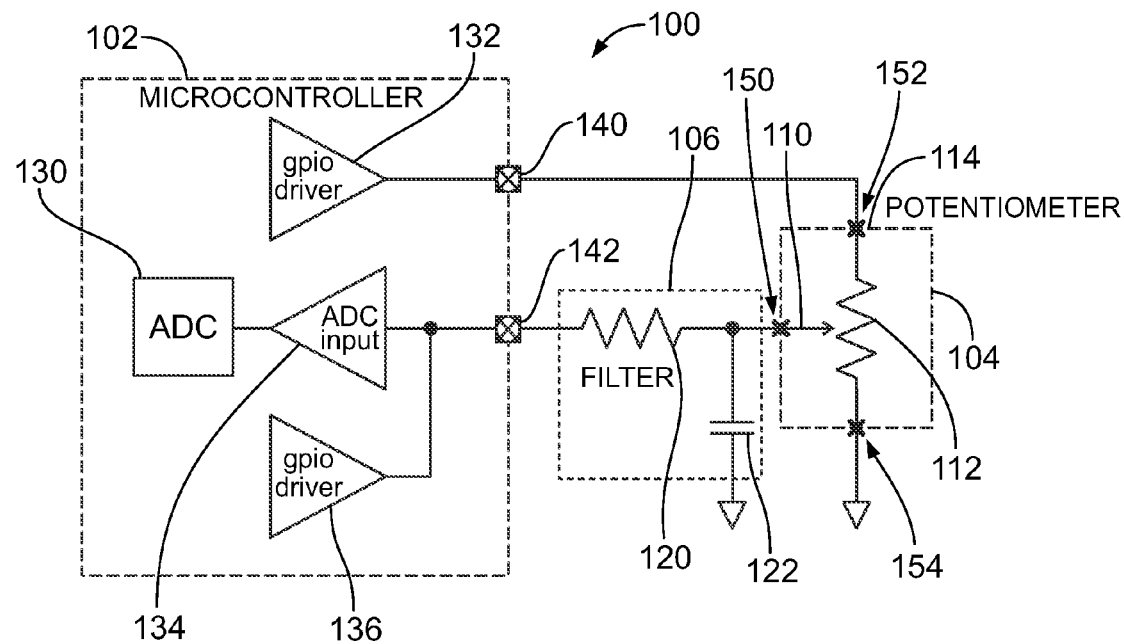
FIG. 1B is the circuit diagram of the detection system in FIG. 1A showing potential points of failure in connections to the potentiometer resulting in potentiometer failure.

FIG. 1B shows the system 100 in FIG. 1A with potential areas for failure of the potentiometer 104. Like element numbers in FIG. 1A represent their counterparts in FIG. 1B. Various potential disruption points such as a first failure point 150, a second failure point 152, and a third failure point 154 may each be the cause of potential breakdowns of the potentiometer 104 resulting in loss of functionality of the device using the potentiometer 104. In certain applications such as a motor overload relay, this loss of functionality may result in subsequent damage to the load protected by the device. Each of the failure points 152, 154, and 156 may result in an overload and failure of the potentiometer 104. The first failure point 150 is at the connection between the potentiometer wiper arm 110 and the analog voltage input/output pin 142 coupled to the ADC 130. The second failure point 152 is at the voltage input 114 coupled to the resistive element 112. The third failure point 154 is at the connection of the potentiometer 104 to ground.

Figure 2B:
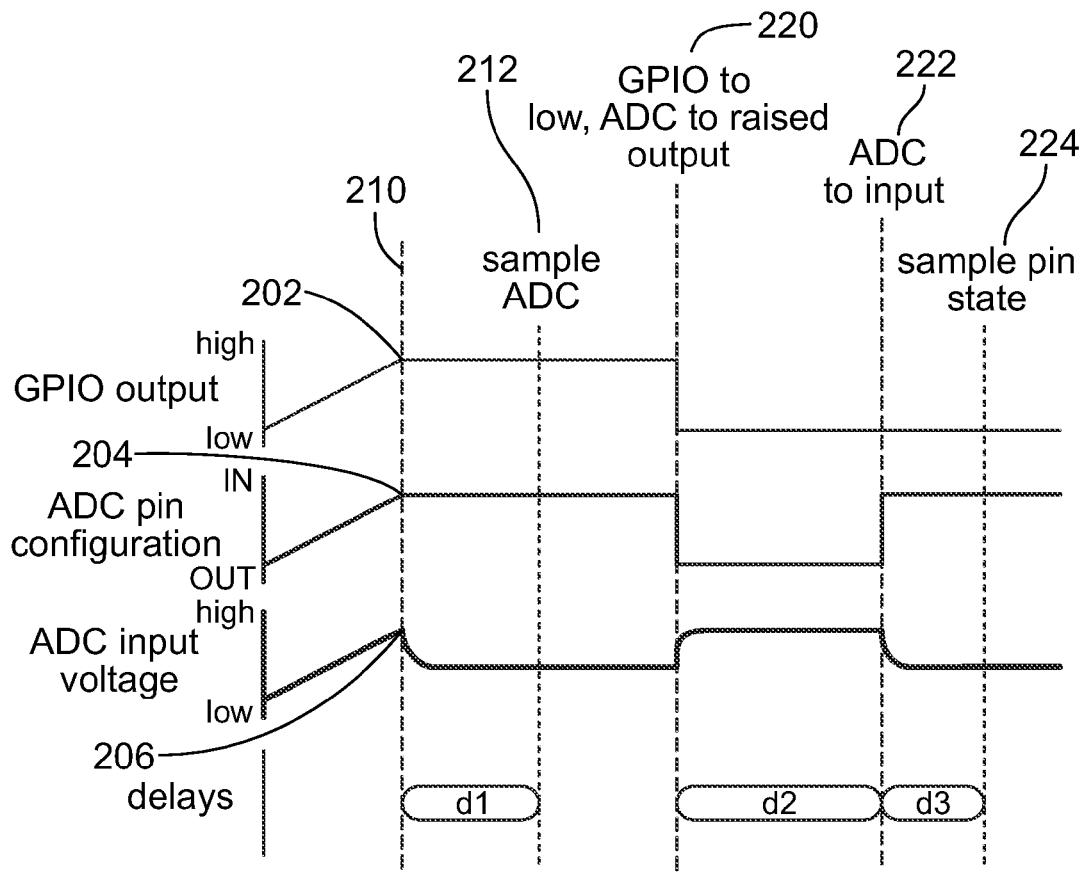
FIG. 2B is a timing diagram showing the signals used in monitoring the potentiometer when no failure has occurred and the wiper arm is within a normal range of values.

In the disclosed example, the microcontroller 102 executes a routine to read the outputs from the potentiometer 104 and, based on those readings, determines whether the potentiometer 104 has failed. The routine also determines which of the three failure points 150, 152, or 154 in FIG. 1B is the cause of the failure. FIG. 2B is a timing diagram that shows the signals used in the process of determining potentiometer failure. FIG. 2B includes the signals 202, 204, and 206 that are the various input and output signals explained in relation to FIG. 2A. The measurement process of the potentiometer 104 by the microcontroller 102 proceeds in an identical sequence as that shown in FIG. 2A. The signals 202, 204, and 206, and time periods 210 and 212 for this process are therefore identical to their counterparts in FIG. 2A.

At a subsequent time period 220, the GPIO driver output signal 202 from the first GPIO driver 132 coupled to the voltage input 114 of the potentiometer 104 is set to a low value, such that both ends of the potentiometer 104 are at the same voltage. Also at the time period 220, the analog input/output pin 142 of the microcontroller 102 is configured as a GPIO output by setting the control signal 204 low. This applies a voltage from the second GPIO driver 136 to the potentiometer wiper arm 110, which is stored in the capacitor 122. After setting the GPIO driver output signal 202 low and the output signal of GPIO driver 136 high, a delay period occurs sufficient for the capacitor 122 to be charged. The delay period therefore is based on the time constant of the circuit formed by the low pass anti-aliasing filter 106 in parallel with the equivalent resistance of the potentiometer 104. At a subsequent time period 222, the pin 142 of the microcontroller 102 is toggled for accepting an ADC input by setting the control signal 204 high. The microcontroller 102 then waits for a maximum delay period that is less than the time constant of the circuit formed by the low pass anti-aliasing filter 106 in parallel with the equivalent resistance of the potentiometer 104. After the delay, at a time period 224, the ADC input voltage signal 206 is sampled. The microcontroller 102 detects whether an open circuit potentiometer failure has occurred using the voltage of the anti-aliasing capacitor 122 when sampled at the time period 224.

Figure 3:
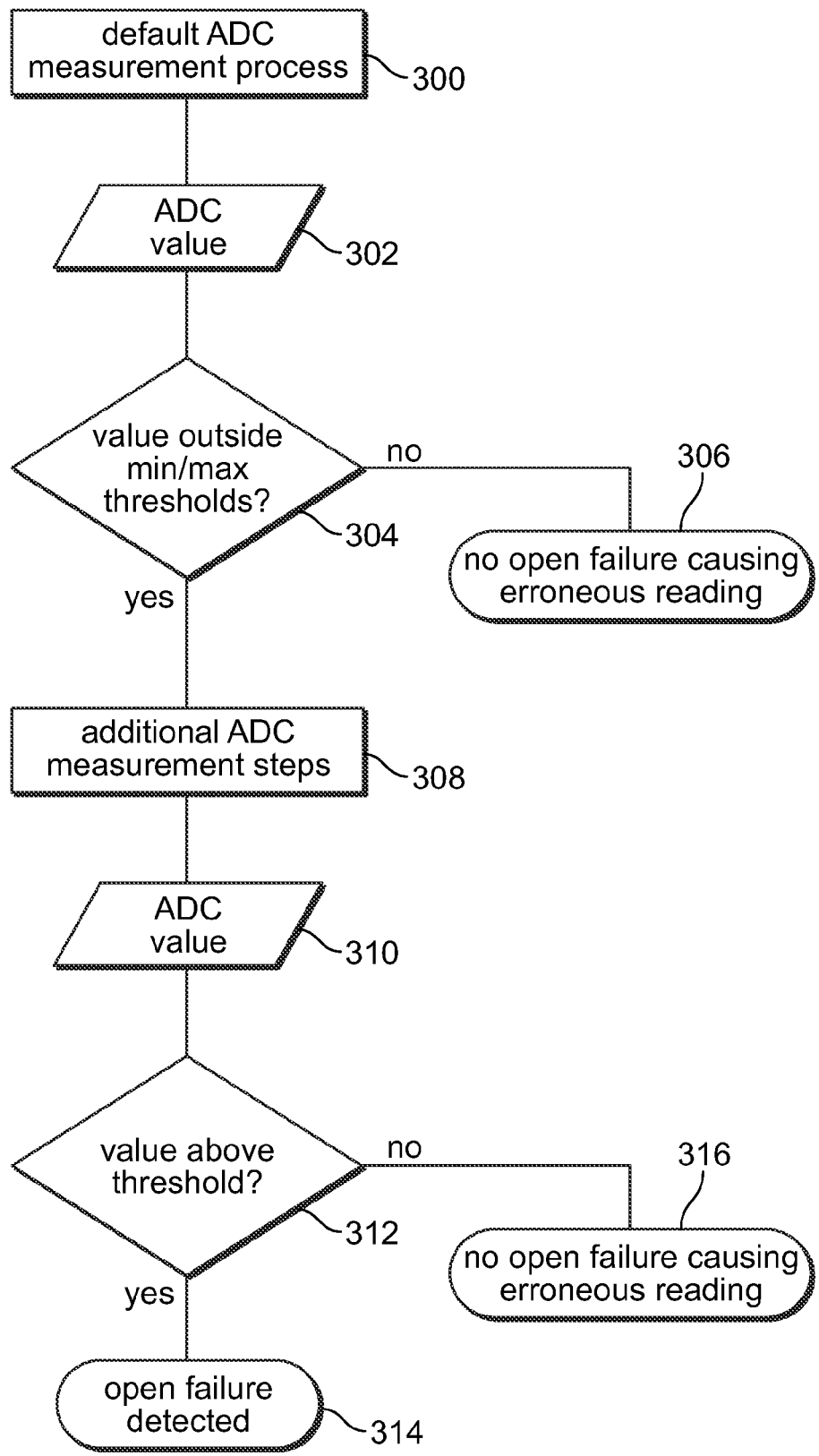
FIG. 3 is a flow diagram of the control algorithm executed by the microcontroller to detect failure of the potentiometer in FIG. 1A.

Using the measurements taken by the process described above, the microcontroller 102 is programmed to apply a decision algorithm described in FIG. 3 to detect the potentiometer open circuit failures shown in FIG. 1B.

The operation of the example decision algorithm to detect a potentiometer open circuit failure will now be described with reference to FIGS. 1A-1B and 2B in conjunction with the flow diagram shown in FIG. 3. The flow diagram in FIG. 3 is representative of example machine-readable instructions for implementing the processes described above to detect a potentiometer open circuit failure. In this example, the machine readable instructions comprise an algorithm for execution by: (a) a processor, (b) a controller, or (c) one or more other suitable processing device(s). The algorithm can be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the microcontroller 102 in FIG. 1A could be implemented by software, hardware, and/or firmware. Also, some or all of the machine readable instructions represented by the flowchart of FIG. 3 can be implemented manually. Further, although the example algorithm is described with reference to the flowchart illustrated in FIG. 3, persons of ordinary skill in the art will readily appreciate that many other methods of implementing the example machine readable instructions can alternatively be used. For example, the order of execution of the blocks can be changed, and/or some of the blocks described can be changed, eliminated, or combined.

The decision algorithm in FIG. 3 applies three threshold values to detect open circuit failures of the potentiometer 104 in FIG. 1A. A minimum threshold value and a maximum threshold value are set according to the optimal range of the potentiometer. The minimum and maximum threshold values are used to determine whether the voltage of the potentiometer is between the minimum and maximum threshold values that represent the expected range of the potentiometer 104. An arm threshold value is determined by the minimum value when the wiper arm 110 is moved to ground. The three threshold values are preferably stored in a static internal memory of the microcontroller 102 (not shown). Of course the values may be stored in dynamic memory, which allows a user to adjust the threshold values.

The decision algorithm first reads the voltage output of the wiper arm 110 of the potentiometer 104 from the ADC 130 according to the process described in FIG. 2A above (300). The ADC value is determined from the input voltage read by the ADC 130 from the wiper arm 110 (302). Following the default ADC measurement process, the ADC value from the wiper arm 110 of the potentiometer 104 is compared against minimum and maximum threshold values (304). These values represent the nominal range (highest and lowest expected voltage) of the potentiometer 104 as used in the system 100 in FIG. 1A. If the ADC value is within the nominal range, no failure of the potentiometer 104 is detected and the algorithm ends (306). If the ADC value is outside of the range established by the minimum and maximum threshold values, the potentiometer 104 may have an open circuit failure and the algorithm provides an additional ADC measurement after a delay (308). After a second ADC value is determined during the process described above in FIG. 2B (310), the new value is compared to an arm threshold value (312). If the second ADC value is above the threshold value, the routine records a potentiometer open circuit failure (314), otherwise if the second ADC value is below the arm threshold value, the algorithm detects that while the original ADC measurement value was outside the nominal range of values there is no open circuit failure (316).

Figure 4A:
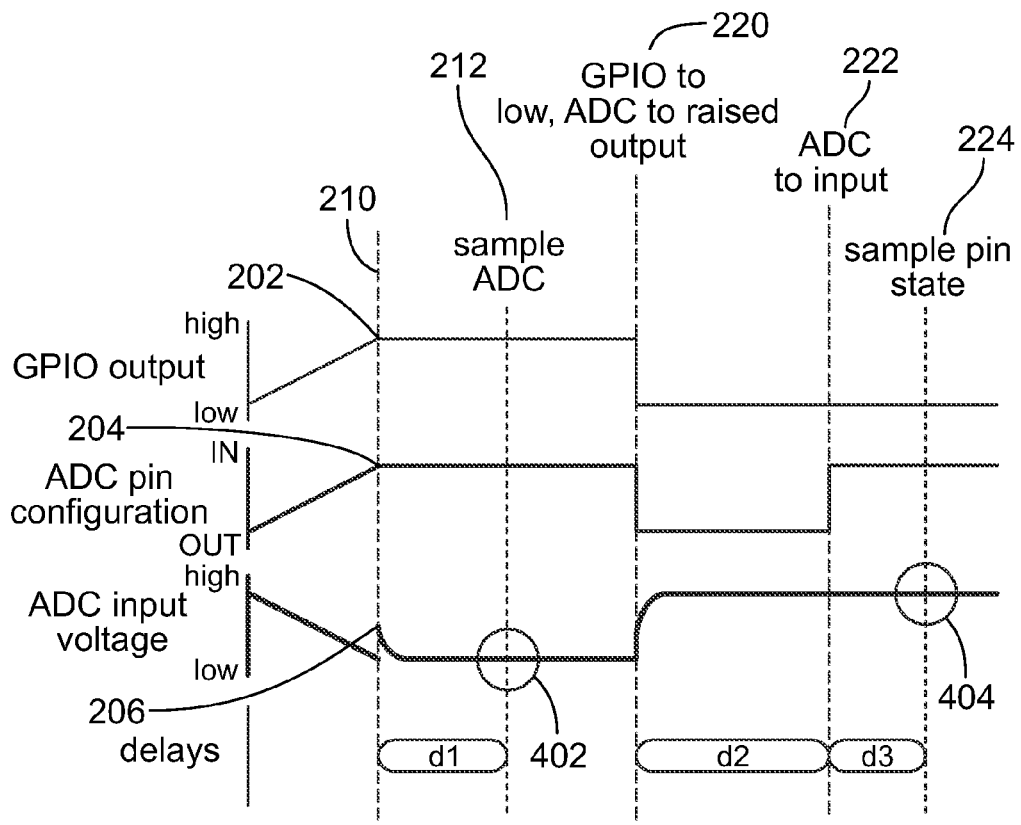
FIG. 4A is a timing diagram showing signals in the detection system in FIG. 1A when a first type of failure is detected.

Returning to FIG. 1B, the cause of failure of the potentiometer 104 may be determined based on analysis of the signals input to the microcontroller 102 during the sequence described above in FIG. 2B. A user may therefore determine whether the disconnection causing the failure is at one of the failure points 150, 152, or 154 in FIG. 1B. FIG. 4A is a timing diagram showing the signals 202, 204, and 206 in FIG. 2A that result when a failure occurs such as at the failure point 150 in FIG. 1B. The different time periods of the process in FIG. 2B are shown with like element numbers in FIG. 4A.

As shown in FIG. 4A, a first ADC measurement value 402 from the input/output pin 142 will be at the minimum value of the ADC input because there is no current through the potentiometer 104 to the filter capacitor 122 of the low pass filter 106 to create a voltage. By comparison of the ADC value 402 with the maximum and minimum threshold values that are stored by the microcontroller 102, the ADC value 402 is outside the parameters (lower than the low threshold value), which causes additional measurements to be made as shown at the time period 222 in FIG. 4A. Thus, the GPIO output 202 is driven low to create a low voltage to the potentiometer 104. The control signal 204 to configure the analog input/output pin 142 is set to low to configure the input/output pin 142 as a GPIO output. The voltage is raised from the second GPIO driver 136 through the pin 142 and current flows through the capacitor 122 creating a stored voltage. After a delay period of the time constant of the low pass filter 106, the control voltage signal 204 is set low to toggle the input/output pin 142 to accept an analog signal to the ADC input 134 at the time period 222. The signal from the wiper arm 110 representing the stored voltage on the capacitor 122 is sampled by the ADC 130 at the time period 224 and the second threshold comparison is performed by the microcontroller 102. As shown in FIG. 4A, an ADC input voltage level 404 from the second sample is at a relatively high level. The comparison of the input voltage level 404 is made with the arm threshold value by the microcontroller 102. Since the second input voltage level 404 exceeds the arm threshold value in this example, the microcontroller 102 determines that a failure has occurred potentially at the failure point 150 in FIG. 1B.

Figure 4B:
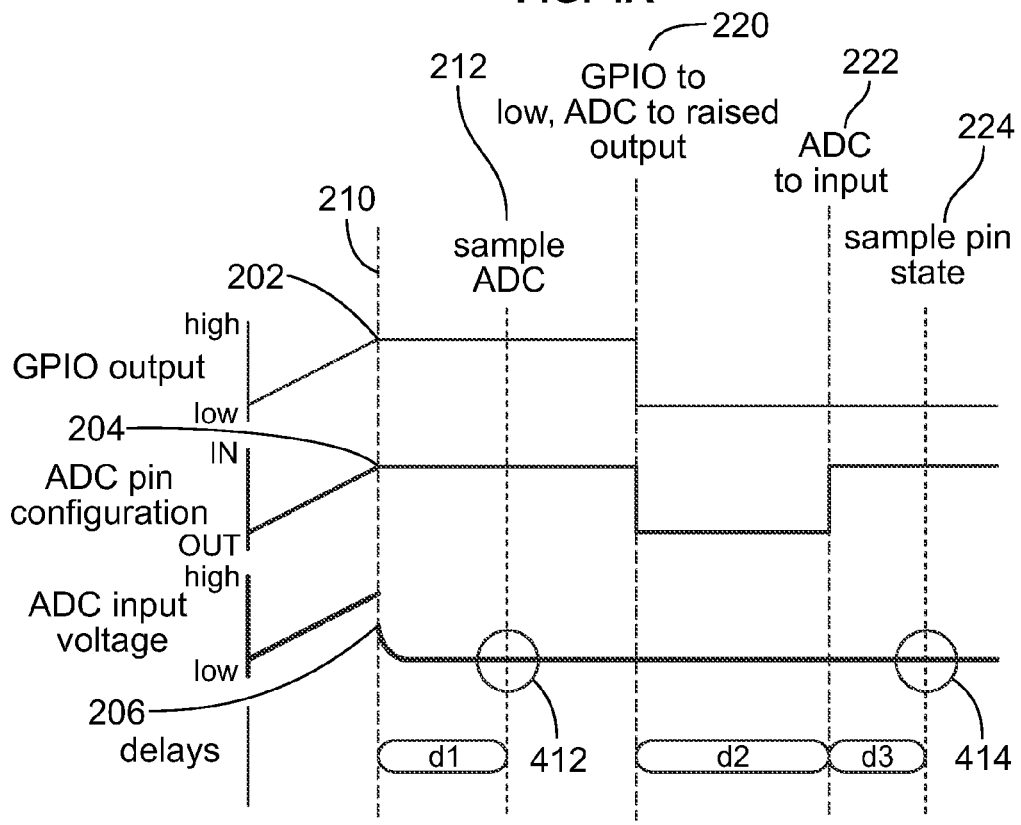
FIG. 4B is a timing diagram showing the signals in the detection system when the wiper arm of the potentiometer is set low and therefore no failure has occurred.

FIG. 4B is a timing diagram of the signals 202, 204, and 206 in FIG. 2A that are used to determine whether a failure has occurred from a disconnection at the failure point 152 in FIG. 1B. As previously explained, the GPIO output voltage 202 is set high to apply voltage to the potentiometer 104. In this case, an ADC input voltage 412 from the wiper arm 110 is at a minimum value below the minimum threshold value. This may be because no current is flowing through the potentiometer 104 due to the break from the failure point 152 at the voltage input 114 in FIG. 1B. This failure may result in a low voltage value at the input/output pin 142, regardless of the actual position of the wiper arm 110 based on the minimum value measurement of the ADC input as shown by the signal value 412 at the time period 212 in FIG. 4B. However, the low input voltage may also be because the wiper arm 110 is positioned at the end of the resistive element 112 closest to ground.

During the second ADC measurement at the subsequent time period 220, the pin controlling the analog input/output pin 142 is raised to a high value and configures the pin 142 as a GPIO output coupled to the second GPIO driver 136. Thus, the current flow into the capacitor 122 is determined by the position of the wiper arm 110 on the resistive element 112. In this case, the circuit formed by the low pass filter 106 and the potentiometer 104 forms a voltage divider.

If the wiper arm 110 is positioned at the end of the resistive element 112 coupled to ground, the voltage across the capacitor 122 when current is applied from the voltage from the second GPIO driver 136 will be low. Thus, a second ADC sample value 414 is not above the threshold value as shown in FIG. 4B and therefore the microcontroller 102 may determine that no failure has occurred since the wiper arm 110 is properly at the end of the resistive element 112 causing the initial ADC voltage value 412 to be below the minimum threshold value.

Figure 4C:
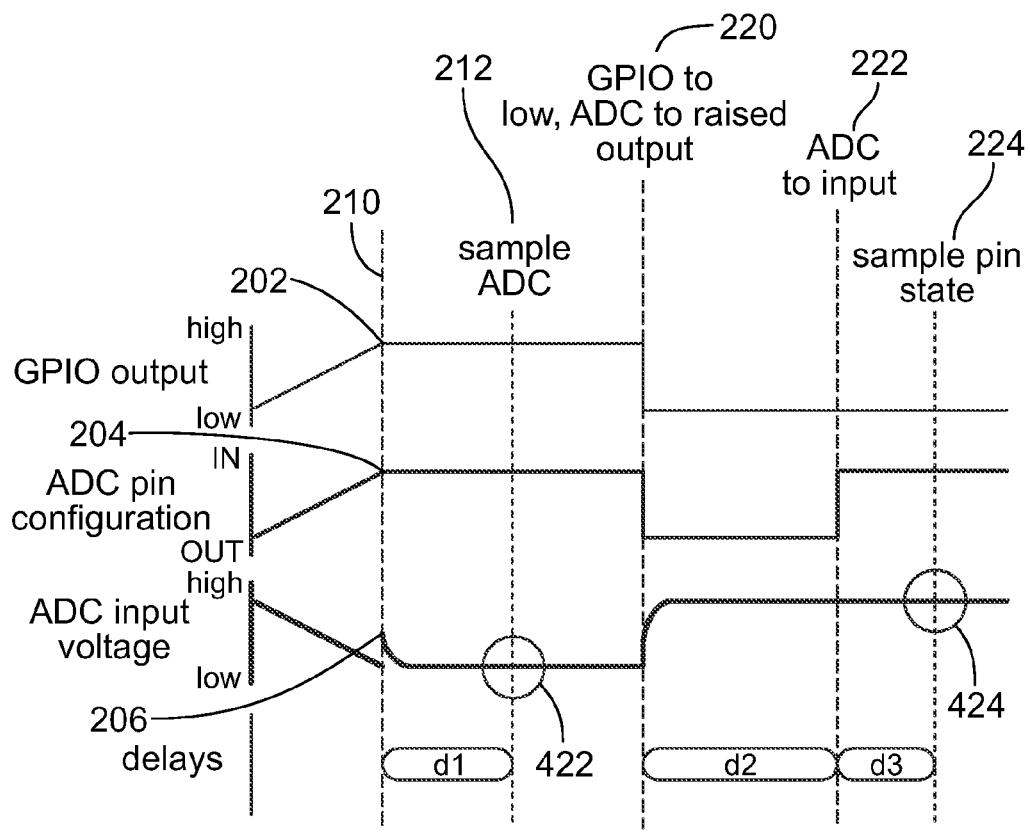
FIG. 4C is a timing diagram showing the signals in the detection system in FIG. 1A when a second type of failure is detected.

FIG. 4C shows the signals 202, 204, and 206 when an actual failure is detected at the failure point 152 in FIG. 1B. As in FIG. 4B, a first voltage sample 422 is below the low threshold value indicating a potential failure. The microcontroller 102 will proceed to take a second ADC value 424 at the time period 224. The second ADC sample value 424 is compared with the second threshold value. If the second ADC sample value 424 is above the arm threshold value as shown in FIG. 4C, the microcontroller 102 determines that failure has occurred at the failure point 152 in FIG. 1B. If the potentiometer 104 is not coupled to the first GPIO driver 132, the capacitor 122 will store voltage and therefore return a high value with the second sample at the time point 224. As explained above, if both ADC samples at time periods 212 and 224 are low, the microcontroller 102 determines that the wiper arm 110 is set at the end of the resistive element 112 coupled to ground and therefore no failure has occurred.

Figure 4D:
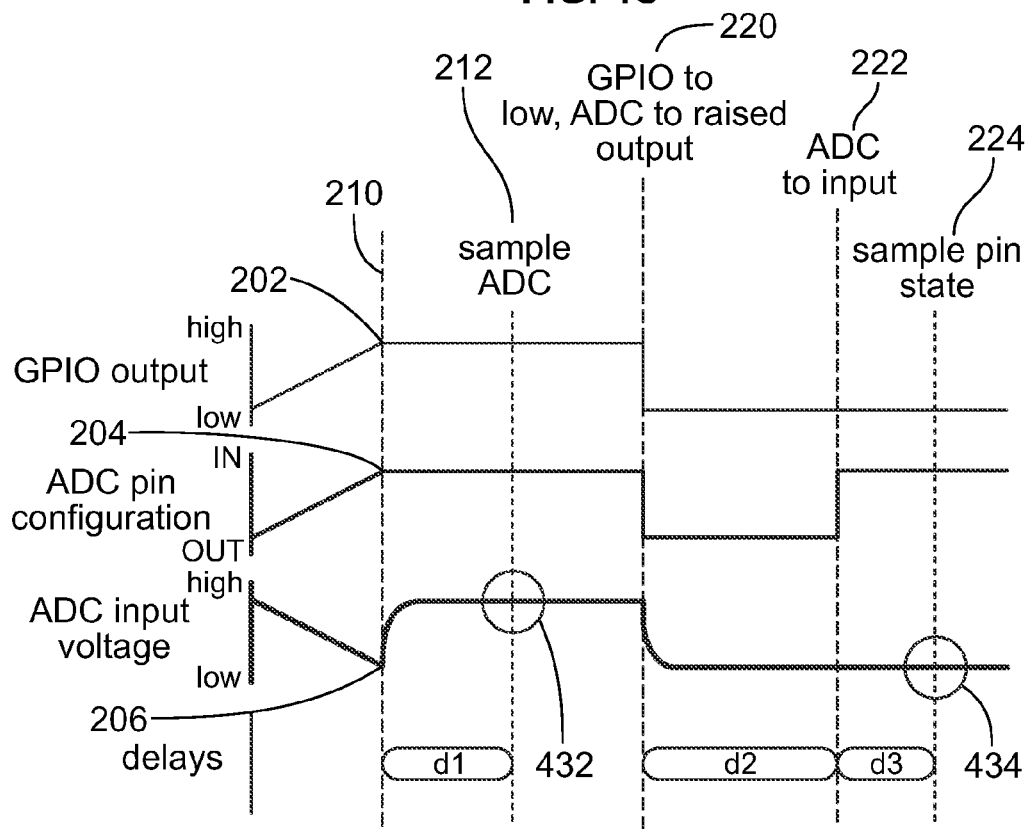
FIG. 4D is a timing diagram showing the signals in the detection system when the wiper arm of the potentiometer is set high and therefore no failure has occurred.

FIG. 4D is a timing diagram showing the signals 202, 204, and 206 in FIG. 2B reflecting the detection of a possible disconnection at failure point 154 in FIG. 1B. After the time period 212, the voltage from the wiper arm 110 is measured by the ADC 130 via the input/output pin 142 and compared with the minimum and maximum threshold values. As shown in FIG. 4D, an ADC input voltage value 432 is greater than the maximum threshold value and therefore a potential failure condition may exist at the failure point 154 in FIG. 1B. However, the input voltage value 432 being above the threshold range may be a result of the wiper arm 110 being positioned at the end of the resistive element 112 coupled to the voltage input 114. The process continues with the control voltage 204 being set low to cause the pin 142 to output voltage from the second GPIO output driver 136 to the wiper arm 110 to charge the capacitor 122. The control voltage signal 204 is then set low and a sample is taken by the ADC 130 of the input voltage signal 206 at the time point 224. As shown in FIG. 4D, an ADC input signal value 434 is low, which indicates that the wiper arm 110 is in a position near the voltage input 114 on the resistive element 112. Thus, the routine on the microcontroller 102 determines that no failure has occurred.

Figure 4E:
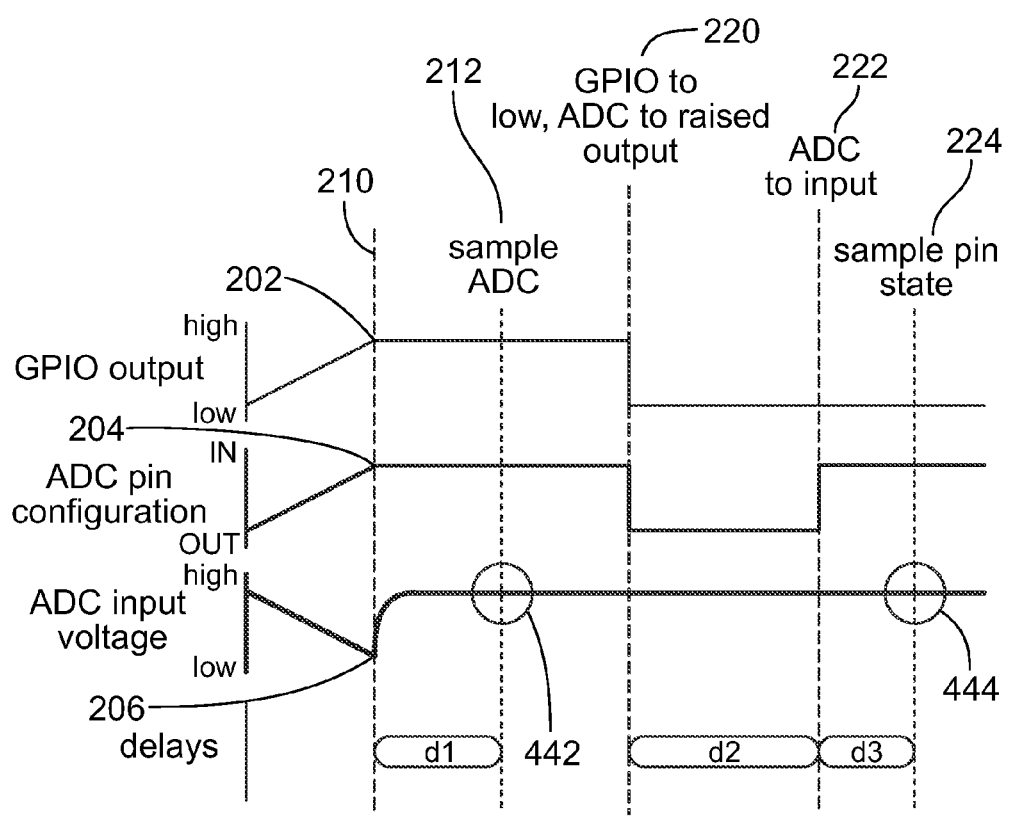
FIG. 4E is a timing diagram showing the electrical signals in the detection system in FIG. 1A when a third type of failure is detected.

FIG. 4E is a timing diagram showing the signals 202, 204, and 206 in FIG. 2B reflecting the detection of a disconnection at the failure point 154 in FIG. 1B. In FIG. 4E, the first sample of the ADC input signal 206 is a high signal while a second sample value 444 of the ADC input signal 206 after the time period 224 is a high value that exceeds the arm threshold value. Since the second sample value 444 of the ADC input signal 206 is a high value, the microcontroller 102 determines that a failure of the potentiometer 104 has occurred at the failure point 154.

While the present invention has been described with reference to one or more particular embodiments, those skilled in the art will recognize that many changes can be made thereto without departing from the spirit and scope of the present invention. Each of these embodiments and obvious variations thereof is contemplated as falling within the spirit and scope of the claimed invention, which is set forth in the following claims.

What is claimed is:

1. A system to detect whether a potentiometer is in an open circuit condition, comprising:
    a potentiometer having a resistive element coupled between a voltage input and ground and an adjustable arm, a position of the adjustable arm on the resistive element determining a voltage output at the adjustable arm; and
    a controller having a first driver coupled to the voltage input of the potentiometer and a second driver coupled to the adjustable arm via a low pass filter including a capacitor, wherein the controller determines failure of the potentiometer by:
        setting the first driver output coupled to the voltage input of the potentiometer to a first value;
        reading, while the voltage input of the potentiometer is set to the first value, a first sample voltage from the adjustable arm, and determining whether the first sample voltage is between a maximum threshold and a minimum threshold value, wherein the maximum and minimum threshold values represent highest and lowest voltages, respectively, of the potentiometer as used in the system;
        setting the first driver output coupled to the voltage input of the potentiometer to a a second value that is lower than the first value;
        applying a voltage to the adjustable arm via the second driver and the low pass filter; and
        reading a second sample from the adjustable arm while the voltage input of the potentiometer is set to the second value and while the voltage is applied to the adjustable arm via the second driver and the low pass filter, and determining whether the second sample is above an arm threshold value, wherein the arm threshold value represents a minimum voltage when the adjustable arm is moved to ground.

2. The system of claim 1, wherein the controller includes a switchable input coupled to the adjustable arm, the switchable input being switchable between an analog to digital converter and the second driver output, the controller controlling the switchable input between coupling the analog to digital converter to the adjustable arm to read the first and second sample voltages and coupling the second driver to apply the voltage to the adjustable arm.

3. The system of claim 1, wherein the controller is a microcontroller.

4. The system of claim 1, wherein a failure of a disconnection of the adjustable arm is determined by the controller when the first sample voltage is below the minimum threshold value and the second sample voltage is above the arm threshold value.

5. The system of claim 1, wherein a failure of a disconnection of the resistive element to the voltage input is determined by the controller when the first sample voltage is below the minimum threshold value and the second sample is above the arm threshold value.

6. The system of claim 1, wherein a failure of a disconnection of the resistive element from ground is determined by the controller when the first sample is above the maximum threshold value and the second sample is above the arm threshold value.

7. The system of claim 1, wherein the threshold values are associated with operating parameters of the potentiometer.

8. The system of claim 1, wherein the threshold values are stored in static memory in the controller.

9. The system of claim 1, further comprising the low pass filter including a capacitor coupled to the adjustable arm, wherein the reading the first and second samples is delayed for a time period associated with a time constant of the capacitor of the low pass filter.

10. A method of determining a failure of a potentiometer having a resistive element coupled between a voltage input and ground and an adjustable arm determining a resistance of the resistive element, the method comprising:
    setting a first driver output coupled to the voltage input of the potentiometer to a first value;
    reading, while the voltage input of the potentiometer is set to the first value, a first sample voltage from the adjustable arm, and determining whether the first sample voltage is between a high threshold and a low threshold value, wherein the high and low threshold values represent highest and lowest voltages, respectively, of the potentiometer as used in a system in which a failure of the potentiometer is being determined;
    setting the first driver output coupled to the voltage input of the potentiometer to a second value that is lower than the first value;
    applying a voltage to the adjustable arm via a second driver output and a low pass filter including a capacitor; and reading a second sample from the adjustable arm and determining whether the second sample is below an arm threshold value, wherein the arm threshold value represents a minimum voltage when the adjustable arm is moved to ground.

11. The method of claim 10, wherein a failure of a disconnection of the adjustable arm is determined when the first sample voltage is below the minimum threshold value and the second sample voltage is above the arm threshold value.

12. The method of claim 10, wherein a failure of a disconnection of the resistive element to the voltage input is determined when the first sample voltage is below the minimum threshold value and the second sample is above the arm threshold value.

13. The method of claim 10, wherein a failure of a disconnection of the resistive element from ground is determined when the first sample is above the maximum threshold value and the second sample is above the arm threshold value.

14. The method of claim 10, wherein the threshold values are associated with operating parameters of the potentiometer.

15. The method of claim 10, wherein the threshold values are stored in static memory.

16. The method of claim 10, wherein the low pass filter including a capacitor is coupled to the adjustable arm, and wherein the reading the first and second samples is delayed for a time period associated with a time constant of the capacitor of the low pass filter.

17. A method of determining a failure of a potentiometer having a resistive element coupled between a voltage input and ground and an adjustable arm determining a resistance of the resistive element using a controller having a first driver output and a second driver output, the method comprising:

coupling the first driver output to the voltage input of the potentiometer and coupling the second driver output to the adjustable arm via a low pass filter including a capacitor;

setting the first driver output coupled to the voltage input of the potentiometer to a first value;

reading, while the voltage input of the potentiometer is set to the first value, a first sample voltage from the adjustable arm after a delay determined by a time constant of the low pass filter;

determining whether the first sample voltage is between a high threshold and a low threshold value, wherein the high and low threshold values represent highest and lowest voltages, respectively, of the potentiometer as used in a system in which a failure of the potentiometer is being determined;

setting the first driver output coupled to the voltage input of the potentiometer to a second value that is lower than the first value;

applying a voltage to the adjustable arm via the second driver output and the low pass filter;

reading, while the voltage input of the potentiometer is set to the second value and while the voltage is applied to the adjustable arm via the second driver and the low pass filter, a second sample from the adjustable arm after a delay determined by the time constant of the low pass filter; and determining whether the second sample is below an arm threshold value via the controller, wherein the arm threshold value represents a minimum voltage when the adjustable arm is moved to ground.

18. The method of claim 17, wherein a failure of a disconnection of the resistive element to the voltage input is determined when the first sample voltage is below the minimum threshold value and the second sample is above the arm threshold value.

19. The method of claim 17, wherein a failure of a disconnection of the resistive element from ground is determined when the first sample is above the maximum threshold value and the second sample is above the arm threshold value.

20. The system of claim 1, wherein the second sample being above the arm threshold value indicates that the potentiometer is in an open circuit condition.

* * * * *